United States Patent
Powell (10) Patent No.: US 6,223,091 B1
(45) Date of Patent: Apr. 24, 2001

(54) ALARM EVENT GENERATOR APPARATUS, MEANS AND SYSTEM

(75) Inventor: Terry Wayne Powell, Johnson City, TN (US)

(73) Assignee: Siemens Energy & Automation, Inc., Alpharetta, GA (US)

(*) Notice: Subject to any disclaimer, the term of this patent is extended or adjusted under 35 U.S.C. 154(b) by 0 days.

(21) Appl. No.: 09/087,152

(22) Filed: May 29, 1998

(51) Int. Cl.[7] .................................................. G05B 9/02
(52) U.S. Cl. ........................ 700/80; 700/21; 700/78; 700/79; 700/81; 700/109; 29/593; 29/840
(58) Field of Search ................................. 700/21, 78, 79, 700/80, 81, 109; 29/593, 840

(56) References Cited

U.S. PATENT DOCUMENTS

| | | | |
|---|---|---|---|
| 4,030,868 | 6/1977 | Williams | 702/42 |
| 4,099,239 | 7/1978 | Williams | 702/82 |
| 4,275,439 * | 6/1981 | Kuwata | 700/9 |
| 4,571,583 * | 2/1986 | Giordano | 340/692 |
| 5,355,395 * | 10/1994 | Kenneth et al. | 376/216 |
| 5,560,533 | 10/1996 | Maenishi | 228/8 |
| 5,715,178 * | 2/1998 | Scarola et al. | 700/46 |
| 5,768,119 * | 6/1998 | Havekost et al. | 700/3 |
| 5,836,071 * | 11/1998 | Falcone et al. | 29/593 |
| 5,940,964 * | 8/1999 | Mugiya | 29/840 |
| 6,025,998 * | 2/2000 | Kitade et al. | 29/840 |

* cited by examiner

*Primary Examiner*—Paul P. Gordon
*Assistant Examiner*—Ramesh Patel (57) ABSTRACT

An alarm event generation method and apparatus for signaling an alarm (436, 1400) for a process control system (100). The process control system (100) monitors a production run using a computer system (108). The computer system (108) collects process data corresponding to the production run from operator workstations (104, 106) and stores the process data in a process data database (110). The process data includes a plurality of process parameter counts (430) each corresponding to a process parameter type (428). The process parameter counts (430) are polled from the computer system (108). Each process parameter count (430) has a corresponding manufacturing limit (434) to which it is compared. When a polled process parameter count (430) exceeds its corresponding manufacturing limit (434), an alarm (436, 1400) is signaled. While an alarm (436, 1400) is being signaled, the computer system (108) is prevented from collecting and storing process data.

7 Claims, 11 Drawing Sheets

FIG. 14

ALARM EVENT GENERATOR APPARATUS, MEANS AND SYSTEM

FIELD OF THE INVENTION

This invention relates generally to an alarm event generator apparatus, means, system and method and, in particular, to an alarm event generator apparatus, means, system and method for a process control system.

BACKGROUND OF THE INVENTION

Process control systems may be used to monitor conditions of a manufacturing process and to vary production parameters based on the monitored conditions. A process control system designed for manufacturing circuit boards is described by Yasuhiro Maenishi in U.S. Pat. No. 5,560,533. Maenishi shows that a monitored condition at a location along a production line may be used to change the operating conditions upstream or downstream of the monitored location to prevent a defect occurrence.

SUMMARY OF THE INVENTION

The present invention provides an alarm event generation apparatus, means, system and method for generating an alarm signal for a process control system. The process control system monitors a current production run using a computer system for collecting and storing process data. The process data for the current production run includes a plurality of process parameters. The process parameters are polled from the computer system. Each process parameter has a corresponding manufacturing limit to which it is compared. When a polled process parameter exceeds its corresponding manufacturing limit, an alarm signal is generated. The computer system is prevented from collecting and storing process data while an alarm signal is being generated.

It is to be understood that both the foregoing general description and the following detailed description are exemplary, and do not restrict the invention.

One aspect of the invention is an alarm event generator for a process control system, the process control system includes a computer system for collecting and storing process data, the process data including a plurality of process parameters for a current production run, the alarm event generator comprising: polling means for polling the computer system for the process data including the plurality of process parameters for the current production run; parameter limit generating means for providing a manufacturing limit corresponding to each of the plurality of process parameters; comparing means for comparing at least one of the plurality of process parameters to its corresponding manufacturing limit; alarm generating means for signaling a manufacturing alarm when at least one of the plurality of process parameters exceeds its corresponding manufacturing limit; and control means for preventing the computer system from collecting and storing process data while the alarm generating means is signaling a manufacturing alarm.

Another aspect of the invention is an alarm event generator according to the above description wherein the parameter limit generating means provides a manufacturing limit corresponding to each of the plurality of process parameters by one of (a) calculating the manufacturing limit using process data from previous production runs and (b) receiving the manufacturing limit.

Still another aspect of the invention is an alarm event generator according to the above description wherein the parameter limit generating means provides a manufacturing limit for each of the plurality of process parameters for the current production run by calculating the manufacturing limits using process data from previous production runs according to the following equations:

manufacturing limit=$[u+(3\sqrt{u}+\sqrt{v})]\times$product items in current production run $$u = \frac{\text{total of process parameter in three prior production runs}}{v}$$

where v=total number of product items in three prior production runs.

A further aspect of the invention is an alarm event generator according to the above description wherein the parameter limit generating means provides a manufacturing limit and at least one additional limit corresponding to each of the plurality of process parameters; the comparing means compares at least one of the plurality of process parameters to its corresponding manufacturing limit and to its corresponding at least one additional limit; and the alarm generating means signals a manufacturing alarm when one of the plurality of process parameters exceeds its corresponding manufacturing limit and generates an additional alarm corresponding to at least one additional limit being exceeded by the one of the plurality of process parameters.

Another aspect of the invention is an alarm event generator according to the above description wherein one of the at least one additional limits is an engineering limit and the alarm generating means signals an engineering alarm on an engineering interface.

Still another aspect of the invention is an alarm event generator according to the above description wherein an operator interface is capable of executing a foreground task and a background task, the computer system collects process data using a process control task executing as the foreground task while an alarm event generator task is executing as a background task on the operator interface, and while the alarm generating means is signaling a manufacturing alarm the control means prevents the computer system from collecting process data by preventing the process control task from becoming the foreground task.

A further aspect of the invention is an alarm event generator according to the above description wherein when the alarm generating means signals a manufacturing alarm, the alarm event generator task is executing as the foreground task and the computer system is prevented from collecting process data until an operator enters a root cause and a corrective action.

Still a further aspect of the invention is an alarm event generator according to the above description wherein the process is a circuit board manufacturing process and the plurality of process parameters include: open solder defects; insufficient solder defects; solder bridge defects; solder void defects; misalignment defects; missing part defects; billboard defects; upside-down part defects; defective part defects and raised part defects.

Another aspect of the invention is an alarm event generator according to the above description wherein the plurality of process parameters further include: all solder defects; all placement defects; and all other defects.

A further aspect of the invention is a method of generating an alarm for a process control system, the process control system has a computer system for collecting and storing process data, and the process data includes a plurality of process parameters for a production run, the method comprising the steps of: (a) polling the computer system for the process data including the plurality of process parameters for the production run; (b) providing a plurality of manufacturing limits, each corresponding to one of the plurality of process parameters; (c) comparing at least one of the plurality of process parameters to its corresponding manufacturing limit; (d) signaling a manufacturing alarm when at least one of the plurality of process parameters exceeds its corresponding manufacturing limit; and (e) preventing the computer system from collecting and storing process data while the alarm generating means is signaling a manufacturing alarm.

Still another aspect of the invention is a method of generating an alarm according to the above description wherein step (d) comprises the step of signaling an audible manufacturing alarm and signaling a visual manufacturing alarm.

Still a further aspect of the invention is a method of generating an alarm according to the above description wherein the audible manufacturing alarm sounds like a dog barking and the visual manufacturing alarm looks like a attacking dog.

Another aspect of the invention is a method of generating an alarm according to the above description wherein step (b) comprises providing each of the plurality of manufacturing limits by one of (1) calculating the corresponding manufacturing limit using process data from previous production runs and (2) receiving a corresponding manufacturing limit.

Still another aspect of the invention is a method of generating an alarm according to the above description wherein a manufacturing limit is calculated according to the following equations:

$$\text{manufacturing limit} = [u + (3\sqrt{u} + \sqrt{v})] \times \text{product items in current production run}$$

where $$u = \frac{\text{total of process parameter in three prior production runs}}{v}, \text{ and}$$

v=total number of product items in three prior production runs.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
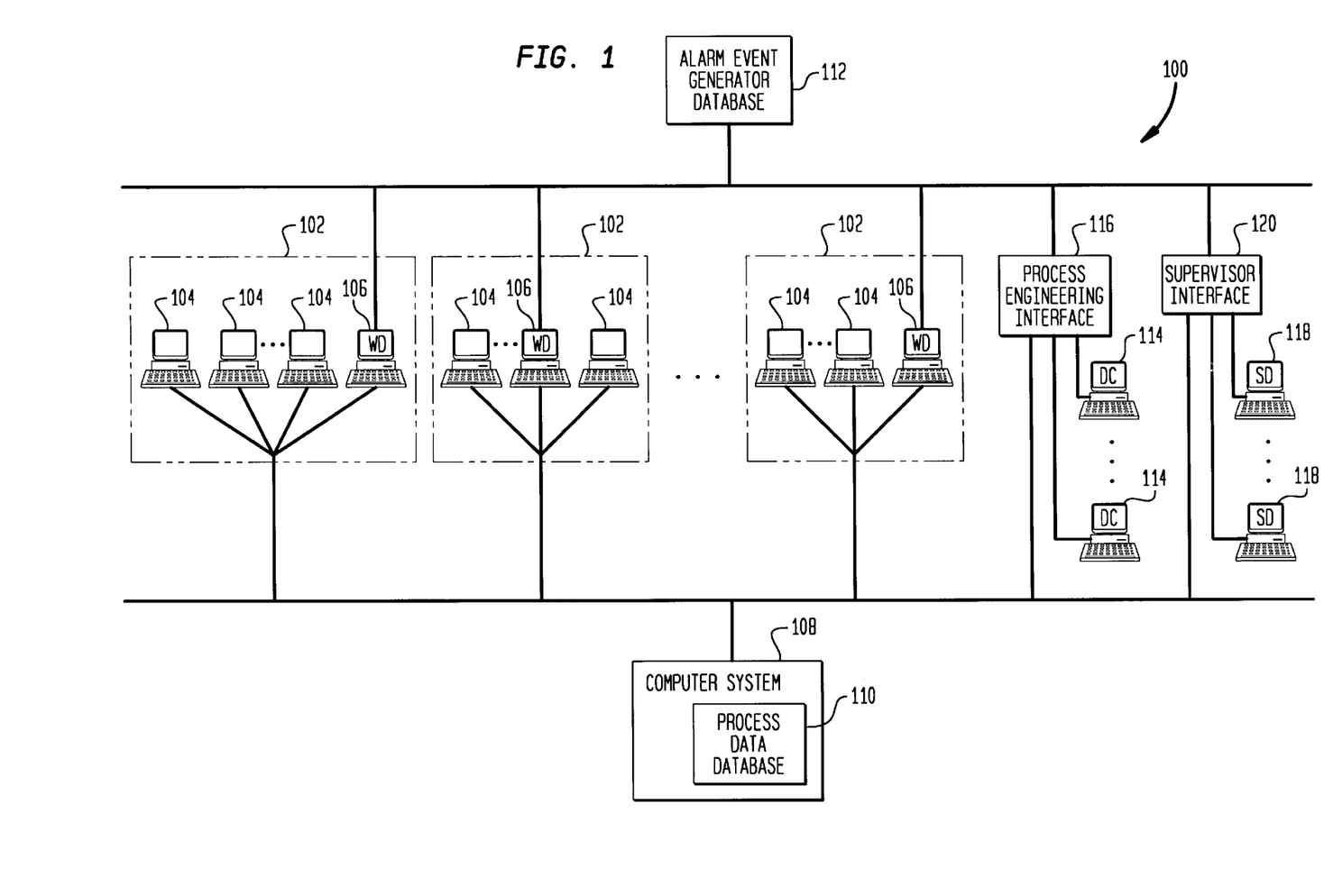
FIG. 1 shows a process control system using an alarm event generator according to the present invention.

Referring now to the drawing, wherein like reference numerals refer to like elements throughout, FIG. 1 shows a process control system 100 having an alarm event generator according to the present invention. A production line (not shown) includes one or more work areas 102 each having a plurality of operator workstations 104, 106. A computer system 108 collects process data corresponding to the production line (not shown) from the operator workstations 104, 106. The process data is stored in a process data database 110. The process data collected from operator workstations 104, 106 in a particular work area 102 includes process parameters corresponding to a production run in the particular work area 102.

Each work area 102 includes a operator workstation 106 that executes a process control task that provides process data to the computer system 108 and executes an alarm event generator task. An operator workstation 106 executing the alarm event generator task polls the computer system 108 for the process data that includes process parameters for the current production run in its work area 102. Each process parameter has a corresponding manufacturing limit. The polled process parameters, the manufacturing limits, work area identification information, and production run identification information are stored in an alarm event generator database 112. The operator workstation 106 compares each process parameter to its corresponding manufacturing limit. When a process parameter exceeds its corresponding manufacturing limit, the operator workstation 106 generates an alarm signal.

Figure 2:
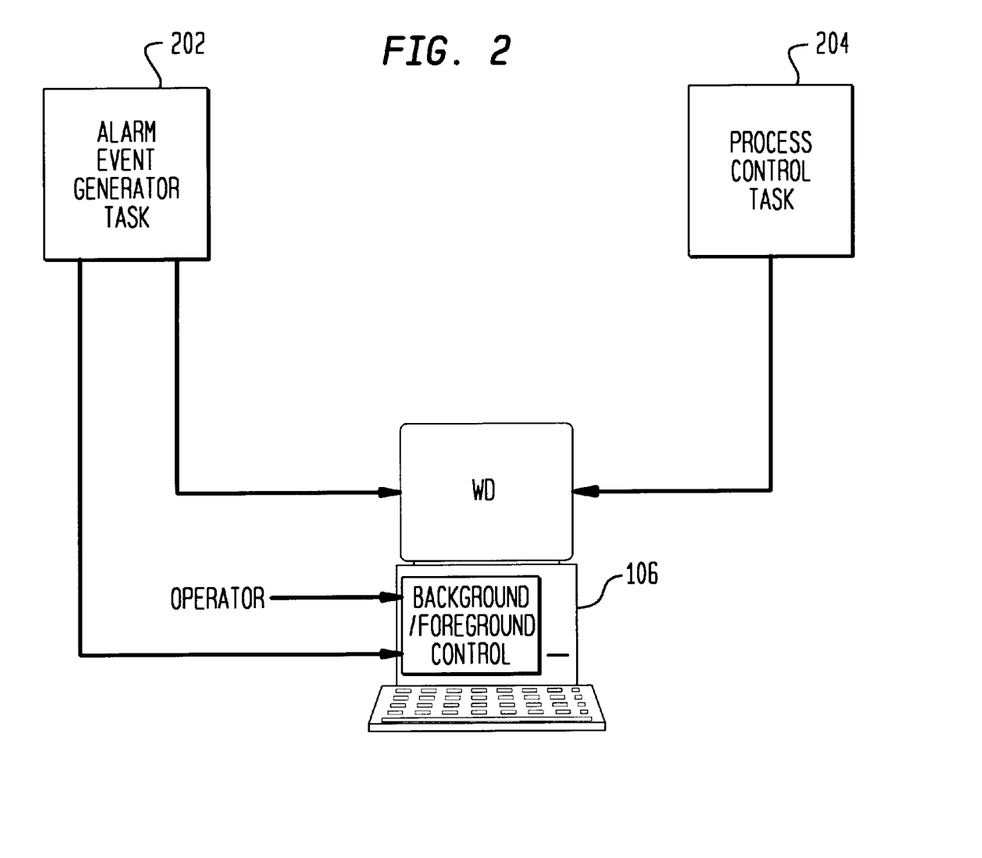
FIG. 2 illustrates the execution of an alarm event generator task and a process control task using an operator workstation.

The operator workstation 106 is capable of executing both a foreground task and a background task. When the alarm event generator task is executed as the foreground task, the process control task is executed as a background task, and vice versa. As illustrated in FIG. 2, both the operator and the alarm event generator task 202 may control which task is the foreground or background task. In an exemplary embodiment, the operator is free to switch between a foreground task and a background task until an alarm signal is generated. When an alarm signal is generated, the alarm event generator task 202 becomes the foreground task, thus, preventing the computer system 108 from collecting data through the process control task 204 of the operator workstation 106. Execution of the alarm event generator task 202 as the foreground task continues until the operator has satisfied the alarm condition.

In an exemplary embodiment, access to the alarm event generator database 112 and the process data database 110 is provided to process engineering workstations 114 and supervisor workstations 118 through a process engineering interface 116 and a supervisor interface 120, respectively. Process engineering workstations 114 may access the alarm event generator database 112 by executing an engineering task, also referred to as a "dogcatcher" task. Supervisor workstations 118 may access the alarm event generator database 112 by executing a supervisor task, also referred to as a "superdog" task.

Figure 3A:
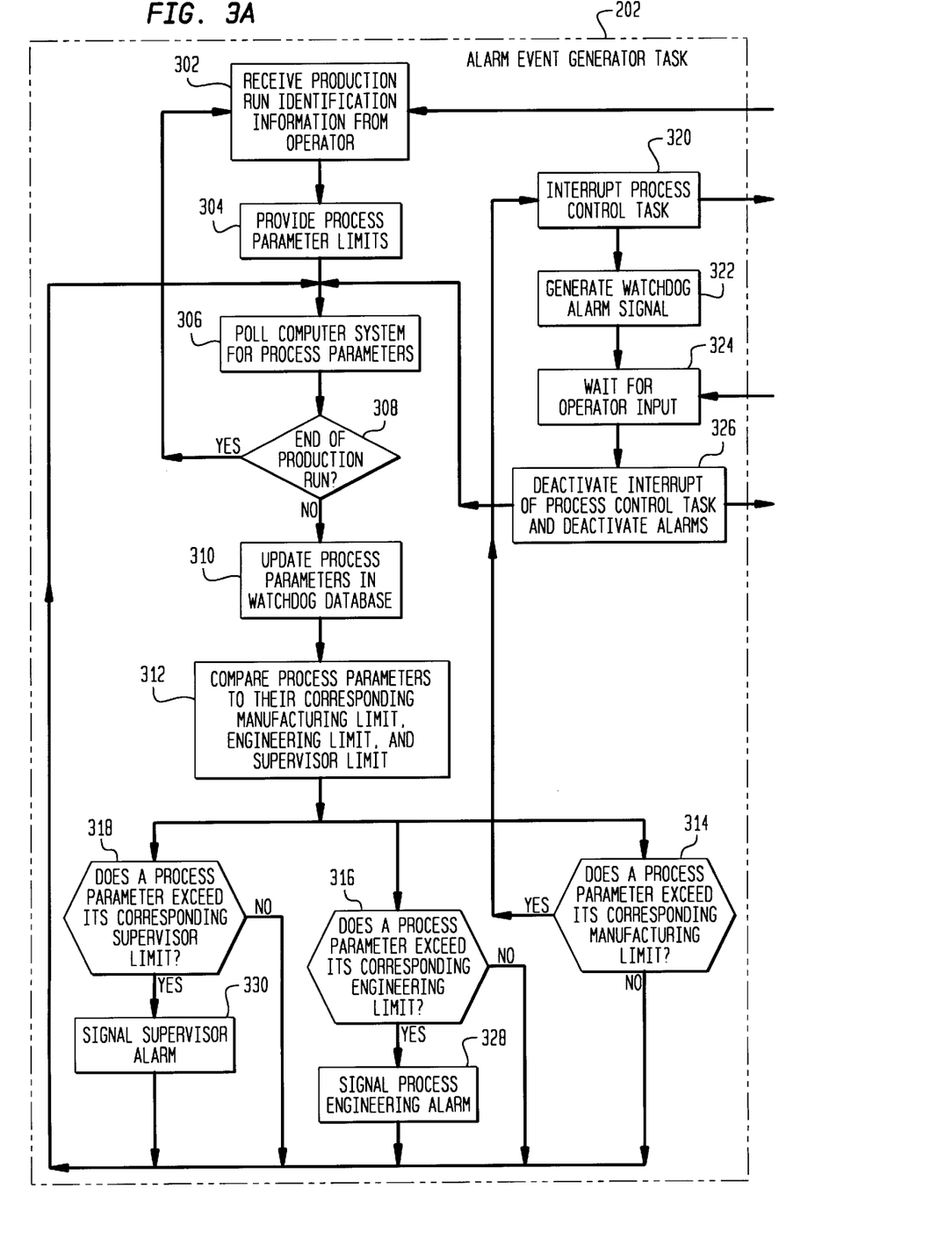
FIGS. 3A and 3B illustrates a flow chart of a method of generating an alarm signal according to the present invention.
Figure 3B:
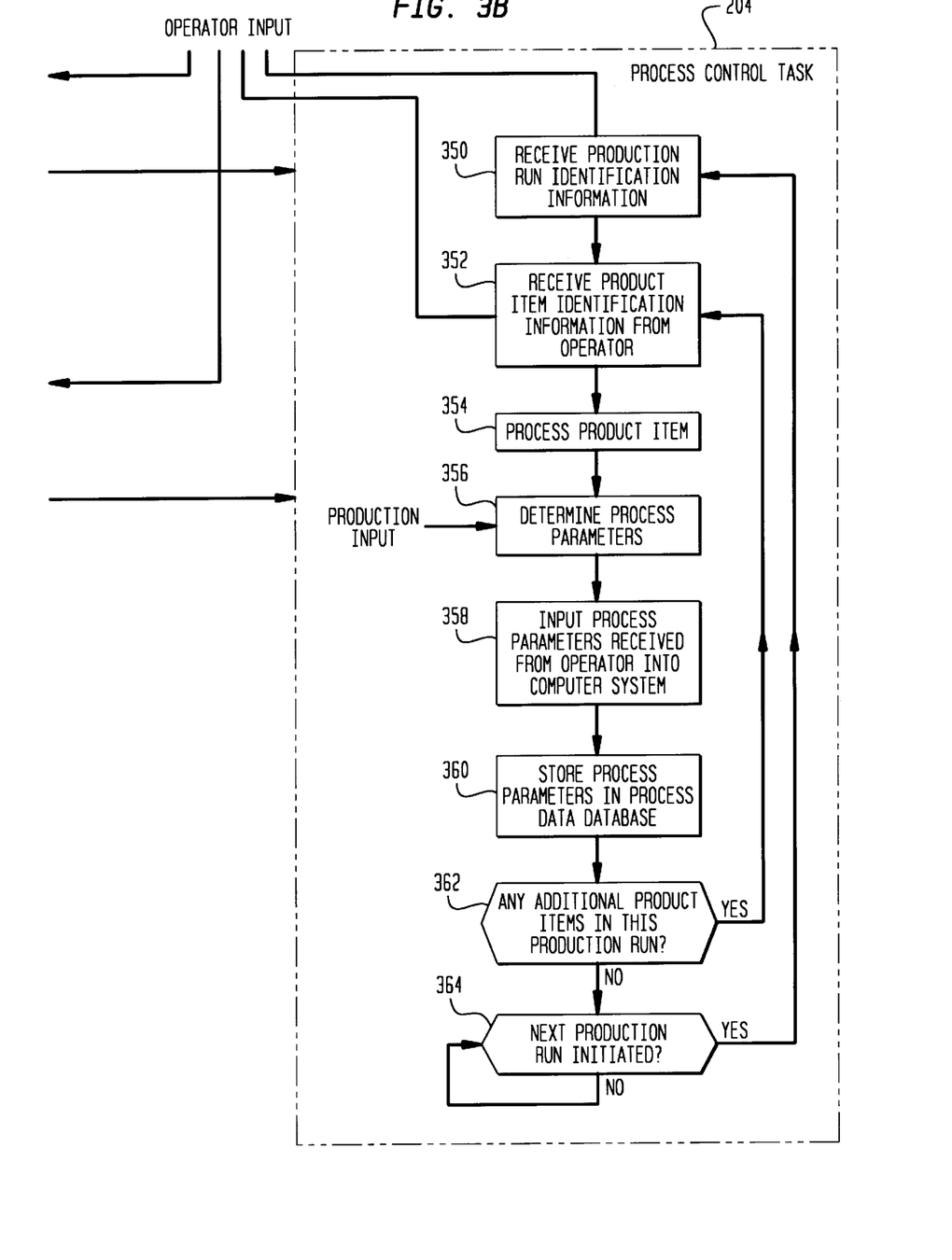

FIGS. 3A and 3B shows a flow chart illustrating a method of generating an alarm signal according to the present invention. The alarm event generator task 202 begins when an operator inputs production run identification information in step 302. In step 304, the manufacturing limits are provided. Manufacturing limits may be received as input from an operator workstation 106, an engineering workstation 114 or a supervisor workstation 118, for example. Manufacturing limits may also be calculated using equations [1] and [2], for example.

$$\text{manufacturing limit} = [u + (3\sqrt{u} + \sqrt{v})] \times \text{product items in current production run} \quad [1]$$

$$u = \frac{\text{total of process parameter in three prior production runs}}{v} \quad [2]$$

In equations [1] and [2], v is the total number of product items in the three prior production runs. In equations [1] and [2], using the basis of three prior production runs to calculate a manufacturing limit is merely exemplary. Manufacturing limits may be based on other than three prior production runs and other statistical process control methods may be used to determine process parameter limits.

In step 306, an operator workstation 106 polls the computer system 108 for process parameters for the current production run in its work area 102. If the end of the current production run is detected in step 308, the alarm event generator task 202 returns to step 302 to receive identification information for the next production run. In step 310, polled process parameter values are updated in the alarm event generator database 112. The process parameters are compared in step 312 to their corresponding parameter limits that were provided in step 304.

In an exemplary embodiment of the present invention, the parameter limits include a manufacturing limit, an engineering limit, and a supervisor limit used for signaling a manufacturing alarm, an engineering alarm, and a supervisor alarm, respectively. The present invention is not limited to manufacturing, engineering, and supervisor limits, and other limits may be used to signal other alarms. An alarm signal may vary depending on the type of workstation, the process parameter, or the extent by which a process limit is exceeded.

Using the results of the comparison from step 312, whether a process parameter exceeds one of its corresponding limits is determined in steps 314, 316, and 318. If a process parameter is determined to exceed its manufacturing limit in step 314, the process control task 204 is interrupted in step 320. As described above, the process control task 204 may be interrupted by making the alarm event generator task 202 the foreground task on the operator workstation 106 and preventing the process control task 204 from becoming the foreground task. In step 322, a manufacturing alarm or a watchdog alarm signal is generated.

After signaling the watchdog alarm in step 322 and interrupting the process control task 204 in step 320, the alarm event generator task 202 waits for operator input in step 324. In an exemplary embodiment, the alarm event generator task displays a process comments form on the operator workstation 106 in step 324 which requires an operator to enter a root cause for exceeding the limit and enter a corrective action. After the operator input is received in step 324, the alarm signal is deactivated in step 326, the process control task 204 is no longer restricted from being a foreground task, and the alarm event generator task 202 proceeds to poll the computer system 108 for additional process parameters in step 306 as described above.

If a process parameter exceeds its engineering limit or supervisor limit in steps 316 or 318, corresponding engineering and supervisor alarms are signaled in steps 328 and 330.

In an exemplary process control task 204, production run identification information is received in step 350 from an operator workstation 104, 106. As each product item progresses along the production run, product item identification information 352 is received from an operator through an operator workstation 104, 106. Product item identification information may be received by scanning a bar code on the product item, for example. In step 354, the product item is processed in the production run. In step 356, process parameters are determined. In step 358, the process parameters are input to the computer system 108 by an operator using an operator workstation 104, 106. In step 360, the process parameters are stored in the process data database 110. If it is determined in step 362 that additional product items are to be processed, the process control task 204 returns to step 352. Otherwise, the process control task 204 waits in step 364 for the next production run to be initiated.

The order of the steps in the flow chart of FIGS. 3A and 3B are exemplary and not restrictive of the present invention. For example, step 308 of detecting the end of a production run may be performed after checking to see if a parameter limit is exceeded in steps 314, 316, and 318. Another example is step 304 of providing process limits may be revisited during a production run to change the process limits.

Exemplary Embodiment

An exemplary embodiment of the present invention is described with reference to FIGS. 4 through 13. This exemplary embodiment is an alarm event generator for a printed circuit board production process. The process parameters for this exemplary embodiment are defects detected during a production run of printed circuit boards. In this exemplary embodiment, the alarm event generator task includes an operator interface (watchdog task) intended for execution on an operator workstation 106, a process engineering interface (dogcatcher task) intended for execution by a process engineer on an engineering workstation 114, and a supervisor interface (superdog task) intended for execution on a supervisor workstation 118.

Watchdog Task

Figure 4:
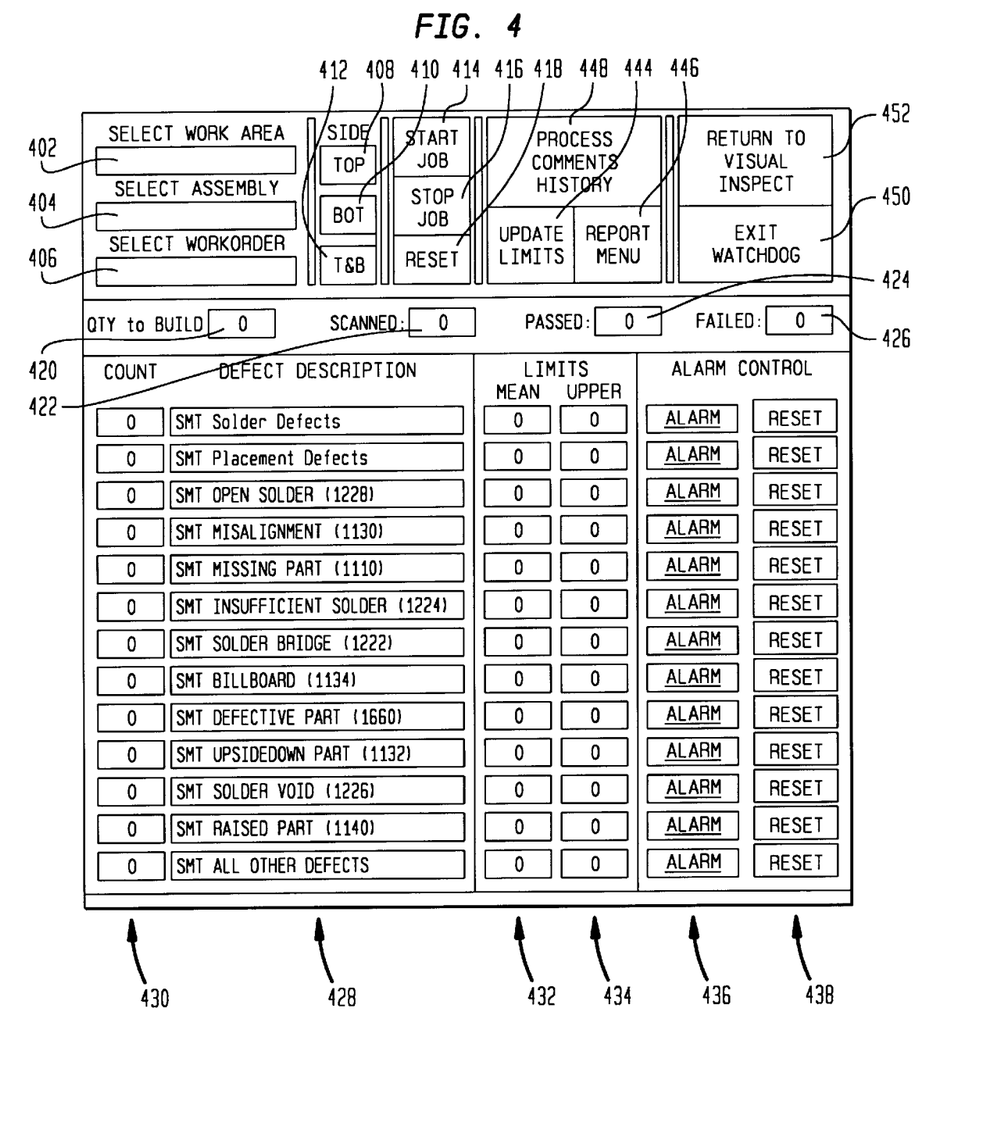
FIGS. 4, 5, 6, 7, 8, 9, 10, 11, 12, 13, and 14 illustrate an exemplary embodiment of the present invention.

FIG. 4 shows a screen of the watchdog task. The operator may provide production run identification information (step 302 in FIG. 3) by entering a work area, an assembly number, and a work order. An operator may enter the work area by clicking on the SELECT WORK AREA drop down list 402. The list that appears includes the work areas within the factory. The operator selects one of the work areas from the list by clicking on the specific work area in which he is located. Upon making the selection, the watchdog task responds with a message box (not shown) asking the operator whether the selected work area is correct. If the operator responds by clicking on the YES option (not shown), the watchdog task continues. If the operator determines the selection made is incorrect and responds by clicking on the NO option (not shown), the operator is prompted to re-select from the work area list.

The operator may enter a product assembly number by clicking on the SELECT ASSEMBLY drop down list 404. The operator selects a specific product assembly number from the drop down list that includes printed circuit boards scheduled to run in the selected work area. Upon making the selection, the watchdog task responds with a message box (not shown) asking the operator to ensure that the product assembly number selected is correct. The operator verifies a correct selection by clicking on a YES option or an incorrect selection by clicking on a NO option as was done when selecting a work area.

A product work order is selected by clicking on the SELECT WORKORDER drop down list 406. The drop down list includes work orders that have been registered in the process data database 110. The operator selects and verifies the selection as was done when selecting a work area and an assembly.

After entry of the work order and the product assembly number, the watchdog task compares the product assembly number and the work order to information in the process data database 110 to ensure the selected product assembly number is registered to the selected work order. If the product assembly number is not registered to the work order, the application responds with a message box (not shown) indicating to the operator that the error exists and recommends that the operator notify the proper individuals and obtain a correct product assembly number and work order. The operator responds to the message by clicking on an OK button (not shown) at which time the application clears all previous entries and the operator must renter previous data. If the product assembly number is registered to the work order the application freezes the selection and allows further entry by the operator.

The operator selects the side or sides of a printed circuit board by clicking on one of three command buttons TOP 408, BOT 410, and T&B 412 corresponding to the top side, the bottom side, and both the top and bottom sides, respectively. A red band is displayed around the selected side command button 408, 410, 412 to indicate which command button was selected and the selection is then fixed.

After entry of the work area, assembly number, work order, and board side, the START JOB 414 and RESET 418 command buttons are activated. The watchdog task will begin polling the process data database 110 when the operator clicks the START JOB command button 414. After the operator clicks the START JOB command button 414, the watchdog task creates a work area table in the alarm event generator database 112 corresponding to the work area selected from the SELECT WORK AREA drop down list 402. The watchdog task enters the start date, start time, product assembly number, work order, and identification information for each product item identified by the process data database 110 as corresponding to the work order. In this exemplary embodiment, product items are identified by barcodes.

The RESET command button 418 may be used by an operator to stop the watchdog task and clear all data in the work area table. Clicking on the RESET command button 418 deletes all data and does not allow any data to be written to the work area table. The RETURN TO VISUAL INSPECT command button 440 minimizes the watchdog task so it executes as a background task to allow access to the process control task 204. The watchdog task may be exited by clicking on the EXIT WATCHDOG command button 442 after clicking on the RESET command button 418.

The data box 420 labeled QTY TO BUILD displays the quantity of printed circuit boards to be built in the work order. The data box 422 labeled SCANNED displays the number of printed circuit boards for which barcodes have been scanned by operators in the work area. This information may be used to ensure that all printed circuit boards are scanned. The data box 424 labeled PASSED displays the quantity of scanned printed circuit boards in the current work order without detected defects. The data box 426 labeled FAILED displays the quantity of scanned printed circuit boards in the current work order having detected defects.

The watchdog task monitors defects corresponding to thirteen defect types 428. In this exemplary embodiment, the defect types 428 include open solder defects, insufficient solder defects, solder bridge defects, solder void defects, misalignment defects, missing part defects, billboard defects, upside-down part defects, defective part defects, raised part defects, all solder defects, all placement defects, and all other defects. Each defect type 428 has a corresponding defect count 430 of the number of defects in the current work order, a mean limit 432, an upper limit 434, a defect type alarm 436, and a alarm reset 438.

Table 1 shows examples of upper and mean limits 432, 434 calculated using equations [1] and [2]. For each defect type 428, the total number of product items in the last three work orders having a defect of that type are calculated. In the example of Table 1, the last three work orders included 704 product items and the current work order includes 200 items. The mean limit ratio is calculated using equation [2] above. If no defects were detected in the last three work orders for a particular defect type or if the number of defects is less than a predetermined minimum, a minimal value is provided for calculating the corresponding limits. In table 1, the minimal value of three is substituted for the Insufficient Solder and Solder Void defect types. The upper limit ratio is calculated using equation [1] above. The mean limits and upper limits are calculated by multiplying the mean limit ratio and upper limit ratio by the quantity of two hundred product items in the current work order. The UPDATE LIMITS command button 444 then recalculates the mean and upper limits 432, 434. Only process engineering personnel may alter the product limits using a separate interface screen accessible only by process engineering.

TABLE 1

| Defect Type | Total Defects in Last 3 Work Orders | Mean Limit Ratio | Upper Limit Ratio | Mean Limit | Upper Limit |
|---|---|---|---|---|---|
| ALL SOLDER | 43 | $43/704 = 0.0611$ | $0.0611 + 3 \sqrt{0.0611} \div \sqrt{704} = 0.089$ | 12 | 18 |
| ALL PLACEMENT | 81 | $81/704 = 0.1151$ | $0.1151 + 3 \sqrt{0.1151} \div \sqrt{704} = 0.1535$ | 23 | 31 |
| OPEN SOLDER | 13 | $13/704 = 0.0185$ | $0.0185 + 3 \sqrt{0.0185} \div \sqrt{704} = 0.0338$ | 4 | 7 |
| MISALIGNMENT | 37 | $37/704 = 0.0526$ | $0.0526 + 3 \sqrt{0.0526} \div \sqrt{704} = 0.0785$ | 11 | 16 |
| MISSING PART | 14 | $14/704 = 0.0199$ | $0.0199 + 3 \sqrt{0.0199} \div \sqrt{704} = 0.08358$ | 4 | 7 |
| INSUFFICIENT SOLDER | 0 | $3/704 = .0043$ | $0.0043 + 3 \sqrt{0.0043} \div \sqrt{704} = 0.0117$ | 3 | 5 |
| SOLDER BRIDGE | 29 | $29/704 = 0.0412$ | $0.0412 + 3 \sqrt{0.0412} \div \sqrt{704} = 0.0637$ | 8 | 13 |
| BILLBOARD | 2 | $2/704 = 0.0028$ | $0.0028 + 3 \sqrt{0.0028} \div \sqrt{704} = 0.0088$ | 3 | 5 |
| DEFECTIVE PART | 12 | $12/704 = 0.0171$ | $0.0171 + 3 \sqrt{0.0171} \div \sqrt{704} = 0.0318$ | 3 | 6 |
| UPSIDE-DOWN PART | 11 | $11/704 = 0.0156$ | $0.0156 + 3 \sqrt{0.0156} \div \sqrt{704} = 0.0296$ | 3 | 6 |
| SOLDER VOID | 0 | $3/704 = .0043$ | $0.0043 + 3 \sqrt{0.0043} \div \sqrt{704} = 0.0117$ | 3 | 5 |
| RAISED PART | 5 | $5/704 = 0.0071$ | $0.0071 + 3 \sqrt{0.0071} \div \sqrt{704} = 0.0166$ | 3 | 5 |
| ALL OTHER | 18 | $18/704 = 0.0256$ | $0.0256 + 3 \sqrt{0.0256} \div \sqrt{704} = 0.08435$ | 5 | 9 |

Initially, each alarm reset 438 command button is disabled, each defect type alarm 436 is green to indicate that production of the work order is below the mean limit 432 for each defect type 428, and the defect count 430 for each defect type 428 is set to zero. When a defect count 430 reaches or exceeds its corresponding mean limit 432, the corresponding defect type alarm 436 is illuminated to yellow. Thus, the mean limits 432 provide an indication to an operator that a particular defect category may be increasing toward its upper limit 434. If the watchdog task is executing as a background task when a defect count 430 reaches or exceeds its corresponding upper limit 434, the watchdog task is automatically and immediately maximized and becomes the foreground task on the operator's workstation 106.

When an upper limit 434 is reached or exceeded, an audio alarm is sounded and the corresponding defect type alarm 436 is illuminated to red to provide a visual indication to an operator that the limit is exceeded. When an upper limit 434 is reached or exceeded, the corresponding alarm reset 438 is activated.

Figure 14:
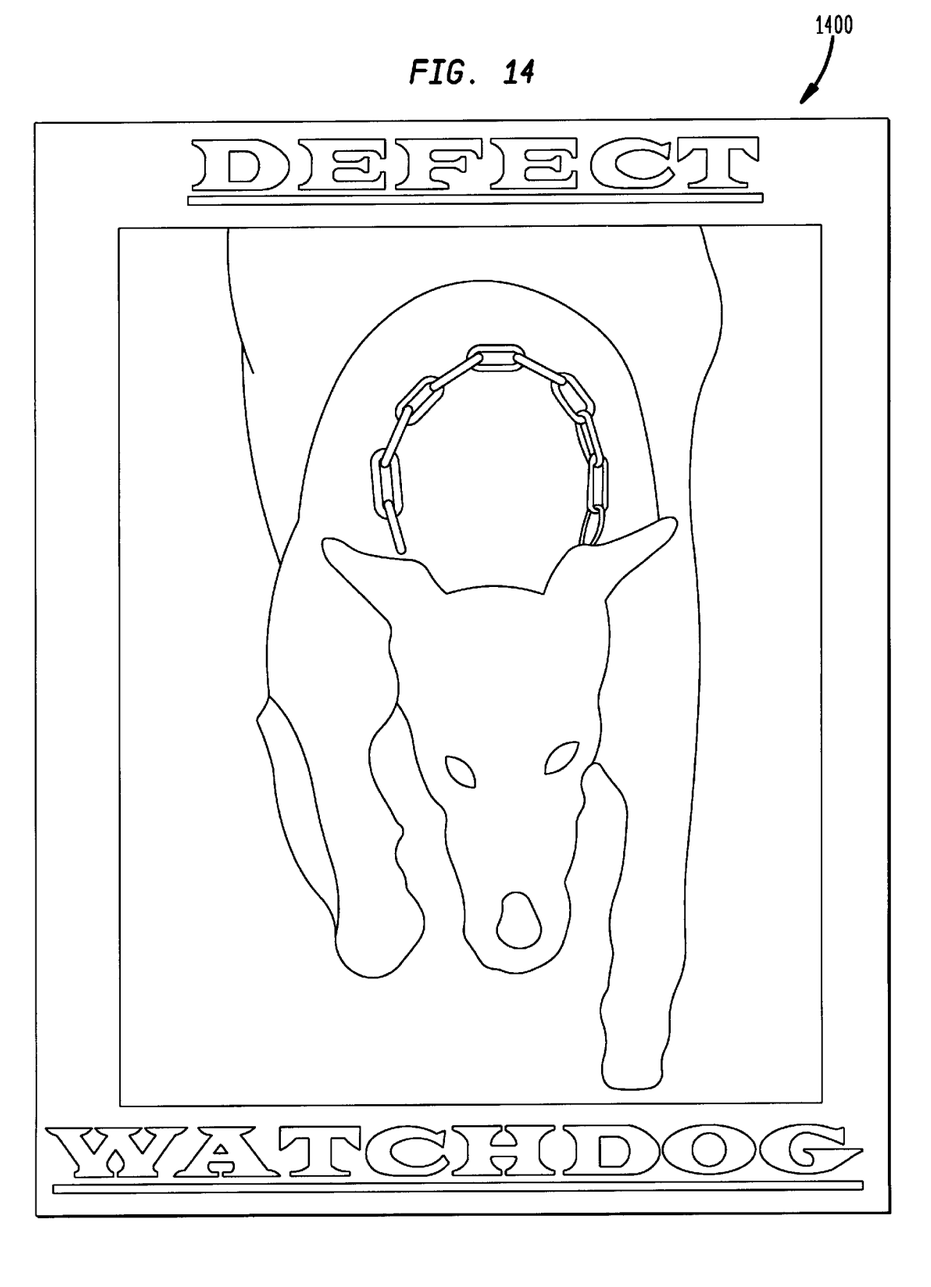

Although a person may be within audible or visual proximity to an alarm signal, the person may ignore the alarm if desensitized to the alarm by repeated signaling of the alarm. To reduce desensitization to the alarm, this exemplary embodiment uses the sound of barking dog as the audible alarm and provides an additional visual alarm of displaying an attacking dog 1400 shown in FIG. 14 on the operator workstation 106. The barking is controlled by a timer to repeat every three seconds.

Figure 5:
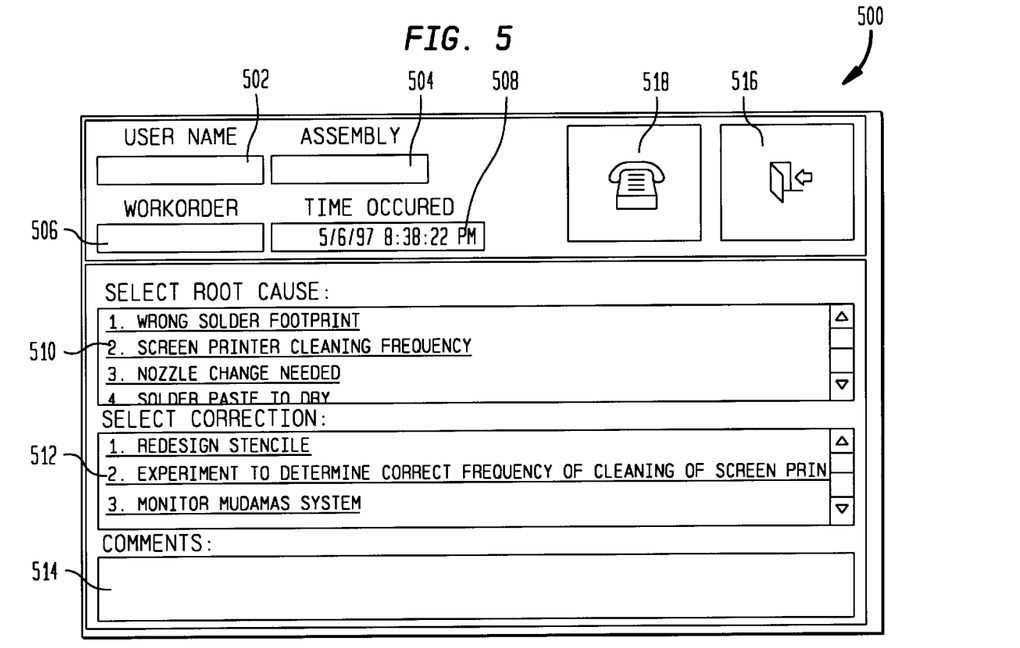
Figure 6:
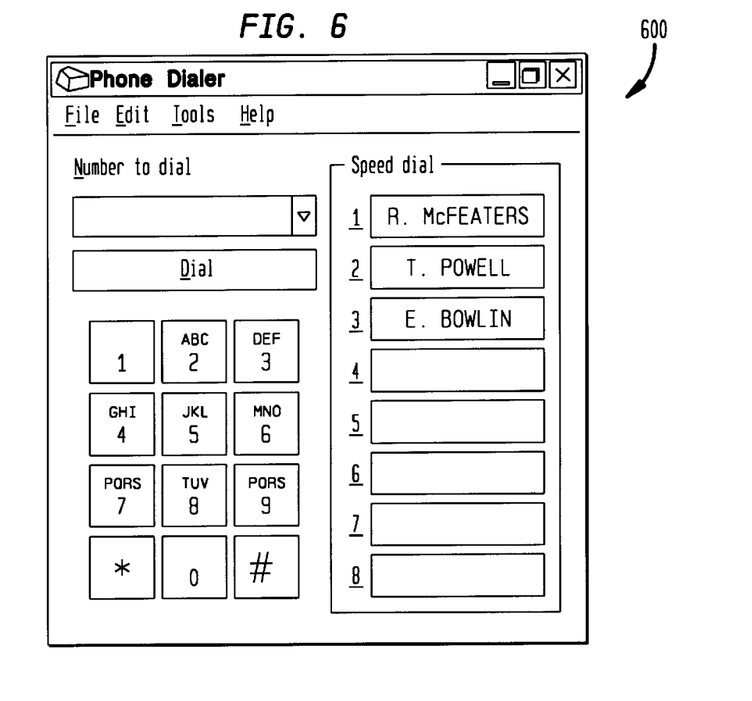

The operator may click on the corresponding alarm reset 438 command button to reset the alarm, turn off the timer of the application, turn off the audible alarm, reset the defect count 430 for the exceeded defect type 428 in the work area table, record the date and time stamp for the occurrence of the alarm in the work area table. The defect count 430 for the specific defect category is reset to zero, the defect type alarm 436 is then reset and illuminated to green, the corresponding alarm reset 438 command button is disabled, and the PROCESS COMMENTS form 500 in FIG. 5 is activated.

The operator must fill in all areas of the PROCESS COMMENTS form 500 before the application will the operator to continue. The operator must enter his/her name, the product assembly number, and the product work order in corresponding areas 502, 504, 506 of the form 500. The time of occurrence is automatically entered in area 508 by the watchdog task. The operator selects from a list 510 of root causes to enable a corresponding corrective action list 512 from which a corrective action is selected. If the root cause of a defect type is not listed in the root causes list 510, the operator may select "none" in both the root cause list 510 and the corrective action list 512 and then describe the root cause and a recommended corrective action in the comments section 514 of the form 500.

After the operator has entered the required information, the form 500 may be exited by clicking on the exit command button 516 that appears as an exit door in the upper right hand portion of the form 500. All areas of the form 500 must be filled in before the operator may exit the form 500 and continue with the watchdog task. Thus, the watchdog task remains as the foreground task and the process control task 204 may not be accessed until the form 500 entry is complete. The application timer is re-started when the form 500 is exited. An operator may use the PROCESS COMMENTS form 500 to notify process engineering personnel using the command button 518 with the telephone on it to call process engineering. Clicking on the command button 518 activates form 600 shown in FIG. 6 which may be used to call process engineering.

Figure 7:
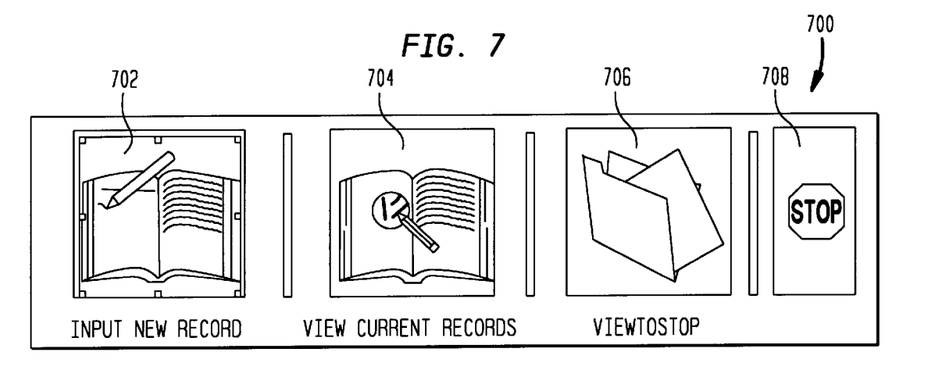

The PROCESS COMMENTS/HISTORY command button 448 in FIG. 4 activates a sub-menu 700 shown in FIG. 7 that allows the operator to perform three additional functions. The INPUT NEW RECORD command button 702 displays a PROCESS COMMENTS form 500 for entry of a specific comment record into a work area table. The VIEW CURRENT RECORDS command button 704 allows an operator to view comments and other information entered during the current production run. The VIEW HISTORY command button 706 shows the operator the root cause, corrective actions, and comments for the specific product from prior runs that is stored in the alarm event generator database 112. Clicking on STOP 708 will exit the sub-menu.

Figure 8:
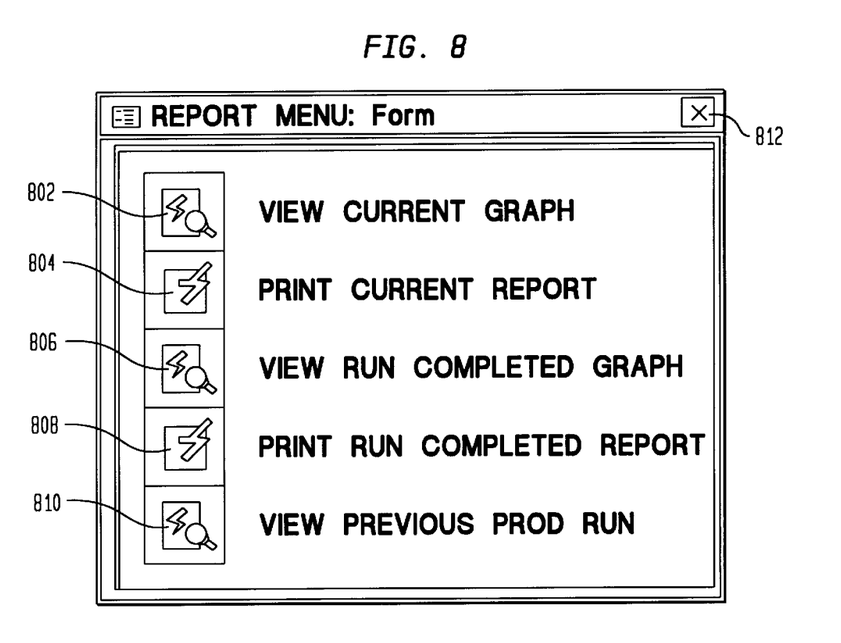
Figure 9:
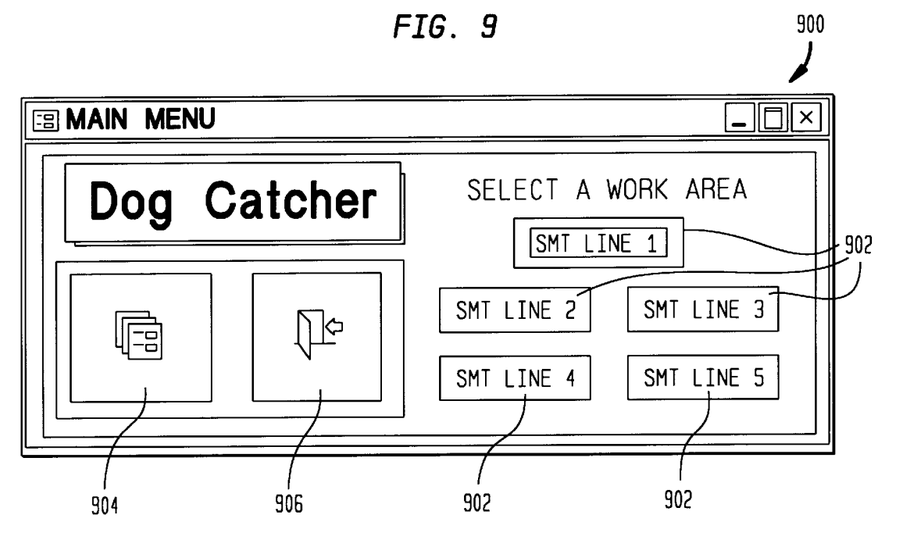

An operator can view and/or print real time reports by clicking on the REPORT MENU command button 446 (FIG. 4) to access a report menu 800 shown in FIG. 8. The VIEW CURRENT GRAPH command button 802 displays a line graph of the current number of defects based on the defect type. The PRINT CURRENT REPORT command button 804 prints the report on a printer. Clicking on the VIEW RUN COMPLETED GRAPH command button 806 or the PRINT RUN COMPLETED REPORT command button 808 will display or print, respectively, a line graph of the number of defects in a completed production run. The VIEW PREVIOUS PROD RUN command button 810 is used to view a line graph of the number of defects in a previous production run. The report menu 800 may be exited by clicking on the box 812 with the X in it.

When no additional product items remain in the work order of the work area, clicking on the STOP JOB command button 416 (FIG. 4) gives the operator the option to write the defect type data for the current work order into a history table in the alarm event generator database 112 or to reset the application and exit.

The operator may then click on the RESET command button to clear the data in the work area table and area process comment table and clear the application screen for the next product to be setup.

Dogcatcher Task

Figure 10:
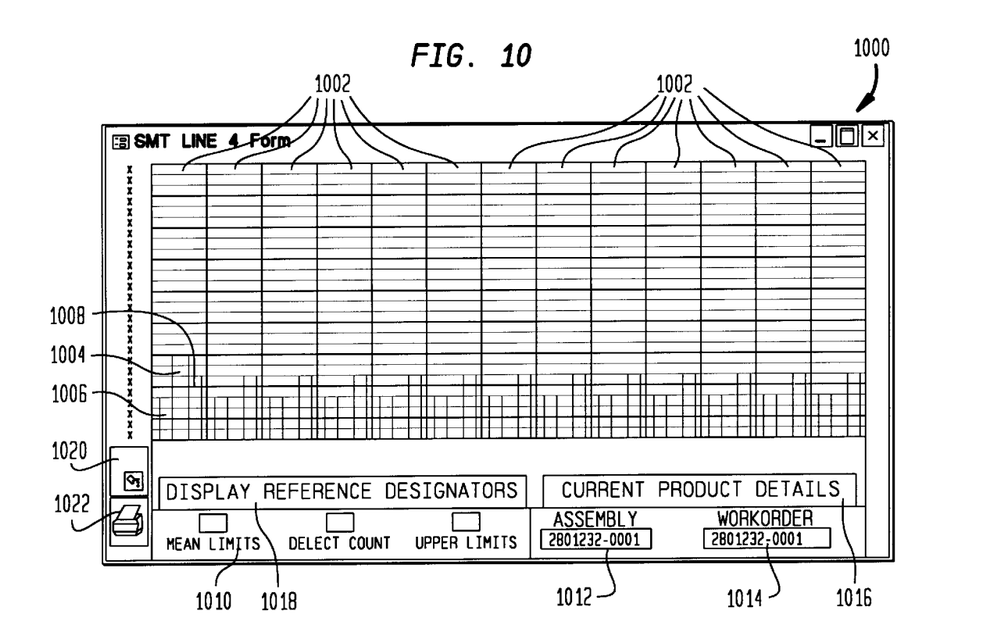

The dogcatcher task allows a process engineer to use a process engineering workstation 114 to monitor process performance in a given work area by monitoring data in the work area tables in the alarm event generator database 112 generated by the watchdog task. The dogcatcher task begins by displaying a main menu form 900 shown in FIG. 9. The main menu form 900 includes work area command buttons 902 each labeled with a specific work area, a cascading command button 904, and an application exit command button 906. A work area monitoring form 1000 such as that shown in FIG. 10 is displayed when a user clicks on a work area command button 902. If multiple work area monitoring forms 1000 are activated by clicking on multiple work area command buttons 902, the multiple work area monitoring forms 1000 may be stacked in a cascaded position by clicking on the cascading command button 904. The dogcatcher task may be exited by clicking on the exit command button 906.

The work area monitoring form 1000 has thirteen columns 1002 each corresponding to one of the thirteen defect types 428 in FIG. 4. Each column 1002 includes three bars, one bar 1004 represents the quantity of defects recorded for the particular defect type, another bar 1006 represents the mean limit 432 for the defect type 428, and the third bar 1008 represents the upper limit 434 for the defect type 428. The bars are scaled according to the largest upper limit 434 among the thirteen defect types 428.

Each column 1002 is labeled (not visible in FIG. 10) with its corresponding defect type which becomes visible when a user moves a cursor onto bars 1004, 1006, 1008 corresponding to the defect type 428. The label becomes invisible when the cursor is moved off the bars 1004, 1006, 1008. A legend 1010 is provided to identify the bars. The product assembly number 1012 and product work order 1014 are displayed at the bottom right portion of the work area monitoring form 1000 for user reference.

Clicking on the CURRENT PRODUCT DETAILS command button 1016 displays detailed current or historical information of the current work order. Clicking on the DISPLAY REFERENCE DESIGNATORS command button 1018 allows printing of a report of the top ten root causes of one of the thirteen defects types 428. A process engineer may use this report as reference information to help determine the root cause of defects in the current work order.

Figure 11:
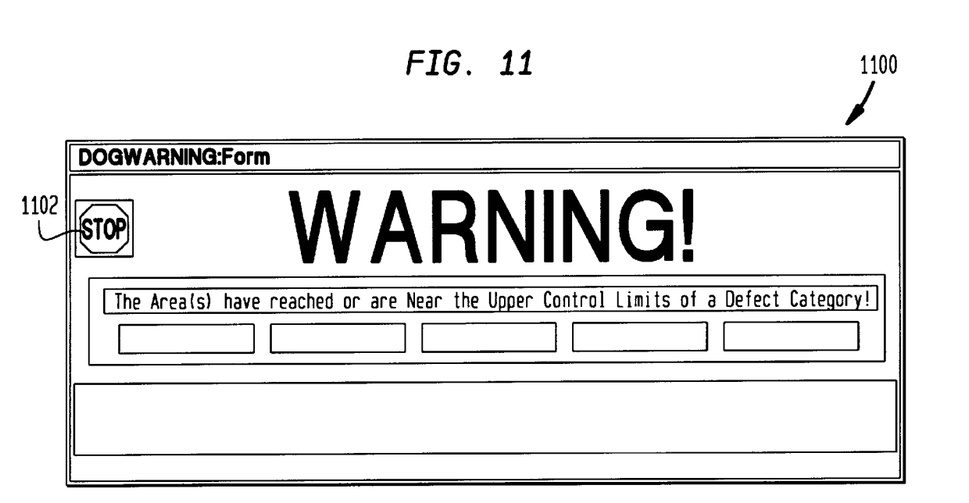
Figure 12:
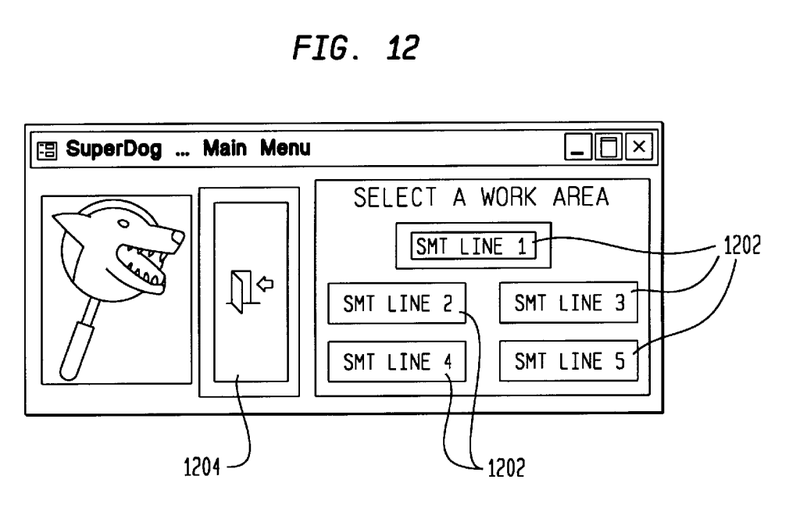

The dogcatcher task may be executed as a foreground task or a background task. If a defect count 430 exceeds an engineering limit while the dogcatcher task is executing as a background task, the dogcatcher application automatically becomes the foreground task and is maximized. A warning form 1100 shown in FIG. 11 is then displayed indicating to the user that a specific work area or work areas have defect counts exceeding their respective engineering limits. In this exemplary embodiment, the engineering limit is two defects less than the upper limit 434.

The warning form 1100 acts as a visual alarm to the user by showing a dog running across the form. An audible alarm of a dog barking is also provided. The alarms may be stopped by clicking on the stop command button 1102. When the alarm is activated it stops the applications timer which is used to obtain updates from the work area tables every 60 seconds. After the alarm is stopped, the user must restart the timer by clicking the restart command button 1020 located above the print command button 1022 on the work area monitoring form 1000 in FIG. 10.

Superdog Task

A supervisor may use the superdog task to monitor the performance of several work areas. The main menu 1200 of the superdog task shown in FIG. 12 includes work area command buttons 1202 used to activate corresponding work area forms 1300 (shown in FIG. 13) and an exit command button 1204 to close the application. The work area form 1300 displays data from a corresponding work area table in the alarm event generator database 112. The work area form 1300 displays the work area 1302, the work order 1304, the product assembly number 1306, the start time of the production run 1308, an indication 1310 of the side of the printed circuit board being built, the elapsed amount of time 1312 the product has been running, the quantity 1314 of printed circuit boards to be built, the quantity of printed circuit boards scanned 1316, the quantity of printed circuit boards passed 1318, and the quantity of printed circuit boards failed 1320.

Figure 13:
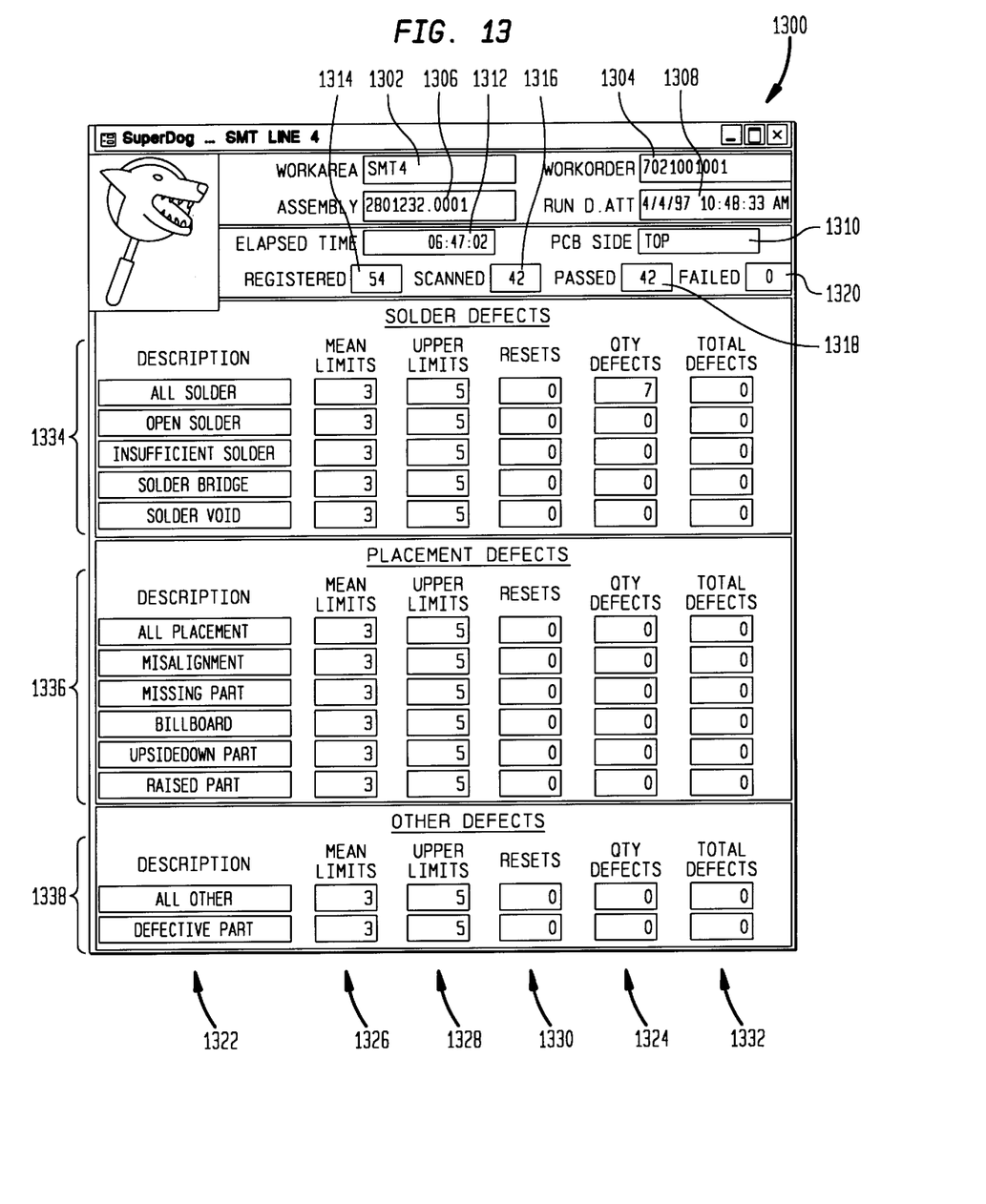

The work area form 1300 also includes defect types 1322, defect counts 1324, mean limits 1326, upper limits 1328, number of resets 1330, and total defects 1332 for the specific defect types 1322. The defect categories are grouped into three groups identified by their labels: SOLDER DEFECTS 1334, PLACEMENT DEFECTS 1336, and OTHER DEFECTS 1338. The information in the work area form 1300 is updated every 20 seconds per the applications timer.

The superdog task may run as a background task to allow the user to start the application and then use other applications on their computer without interruption until a supervisor alarm limit is exceeded. After the application is started and the work area form(s) are activated, the application can then be minimized to run as a background task.

The superdog task notifies the user of process problems by activating an alarm when a defect count 1324 exceeds a corresponding supervisor limit. In this exemplary embodiment, the superdog alarm is a message box (not shown) indicating a process problem and displayed over the top of any other application. The message box continually reappears until the defect problem is reset in the watchdog task. This encourages a user to investigate the source of the superdog alarm. A defect type 1322 is backlit with a yellow bar when its corresponding defect count 430 exceeds its corresponding mean limit 432 and is backlit with a red bar when its corresponding defect count 430 exceeds its corresponding upper limit 434.

The alarm event generator according to the present invention may be used to monitor and analyze process data in real time, and forewarn of a process parameter reaching or exceeding a predetermined limit. It may additionally provide reports of process parameters for a designated production line. The present invention provides the advantage of being capable of operating as a background task on a workstation while another application runs in the foreground until a process parameter exceeds a limit.

Although this invention has been described with reference to a particular embodiment, it is not intended to be limited thereto. Rather, the scope of the invention is intended to be interpreted according to the scope of the appended claims.

What is claimed:

1. An alarm event generator for a process control system, the process control system includes a computer system for collecting and storing process data, the process data including a plurality of process parameters for a current production run, the alarm event generator comprising:

polling means for polling the computer system for the process data including the plurality of process parameters for the current production run;

parameter limit generating means for providing a manufacturing limit corresponding to each of the plurality of process parameters for the current production run by calculating the manufacturing limits using process data from previous production runs according to the following equations:

manufacturing limit=$[u+(3u+v)] \times$product items in current production run $$u = \frac{\text{total of process parameter in three prior production runs}}{v}$$

where v=total number of production items in three prior production runs;

comparing means for comparing at least one of the plurality of process parameters to its corresponding manufacturing limit;

alarm generating means for signaling a manufacturing alarm when at least one of the plurality of process parameters exceeds its corresponding manufacturing limit; and control means for preventing the computer system from collecting and storing process data while the alarm generating means is signaling a manufacturing alarm.

2. The alarm event generator according to claim 1 wherein:
- the parameter limit generating means provides at least one additional limit corresponding to each of the plurality of process parameters;
- the comparing means compares at least one of the plurality of process parameters to its corresponding manufacturing limit and to its corresponding at least one additional limit; and
- the alarm generating means signals a manufacturing alarm when one of the plurality of process parameters exceeds its corresponding manufacturing limit and generates an additional alarm corresponding to at least one additional limit being exceeded by the one of the plurality of process parameters.

3. The alarm event generator according to claim 2 wherein one of the at least one additional limits is an engineering limit and the alarm generating means signals an engineering alarm on an engineering interface.

4. The alarm event generator according to claim 1 wherein an operator interface is capable of executing a foreground task and a background task, the computer system collects process data using a process control task executing as the foreground task while an alarm event generator task is executing as a background task on the operator interface, and while the alarm generating means is signaling a manufacturing alarm the control means prevents the computer system from collecting process data by preventing the process control task from becoming the foreground task.

5. The alarm event generator according to claim 4 wherein when the alarm generating means signals a manufacturing alarm, the alarm event generator task is executing as the foreground task and the computer system is prevented from collecting process data until an operator enters a root cause and a corrective action.

6. The alarm event generator according to claim 1 wherein the process is a circuit board manufacturing process and the plurality of process parameters include: open solder defects; insufficient solder defects; solder bridge defects; solder void defects; misalignment defects; missing part defects; billboard defects; upside-down part s defects; defective part defects and raised part defects.

7. The alarm event generator according to claim 6 wherein the plurality of process parameters further include: all solder defects; all placement defects; and all other defects.

* * * * *